(12) United States Patent
Tan et al.

(10) Patent No.: US 8,247,484 B2
(45) Date of Patent: Aug. 21, 2012

(54) HIGH TEMPERATURE POLYMER COMPOSITES AND METHODS OF MAKING THE SAME

(75) Inventors: Daniel Qi Tan, Rexford, NY (US); Yang Cao, Niskayuna, NY (US); Patricia Chapman Irwin, Altamont, NY (US)

(73) Assignee: General Electric Company, Niskayuna, NY (US)

( * ) Notice: Subject to any disclaimer, the term of this patent is extended or adjusted under 35 U.S.C. 154(b) by 710 days.

(21) Appl. No.: 12/137,564

(22) Filed: Jun. 12, 2008

(65) Prior Publication Data

US 2009/0312474 A1   Dec. 17, 2009

(51) Int. Cl.
 *C08J 3/00* (2006.01)
(52) U.S. Cl. ......... 524/394; 524/544; 524/403; 528/92; 528/411
(58) Field of Classification Search ............... 524/394, 524/544, 403; 528/92; 529/411
See application file for complete search history.

(56) References Cited

U.S. PATENT DOCUMENTS

| | | | | |
|---|---|---|---|---|
| 4,917,810 A * | 4/1990 | Tsunooka et al. | ....... | 252/62.9 R |
| 5,555,219 A * | 9/1996 | Akiyama et al. | ............. | 349/182 |
| 5,638,251 A | 6/1997 | Goel et al. | | |
| 5,650,031 A | 7/1997 | Bolon et al. | | |
| 5,951,908 A | 9/1999 | Cui et al. | | |
| 6,544,651 B2 | 4/2003 | Wong et al. | | |
| 6,632,109 B2 | 10/2003 | Irwin et al. | | |
| 6,762,237 B2 | 7/2004 | Glatkowski et al. | | |
| 6,778,053 B1 | 8/2004 | Irwin et al. | | |
| 6,864,306 B2 * | 3/2005 | Rao et al. | ...................... | 524/394 |
| 7,267,840 B2 | 9/2007 | Ohnishi et al. | | |
| 2003/0017351 A1 | 1/2003 | Hayashi et al. | | |
| 2004/0060730 A1 | 4/2004 | Lauf et al. | | |
| 2004/0265551 A1 | 12/2004 | Takaya et al. | | |
| 2005/0080175 A1 | 4/2005 | Paik et al. | | |
| 2005/0137281 A1 * | 6/2005 | Voss-Kehl et al. | ............ | 523/160 |
| 2005/0161149 A1 | 7/2005 | Yokota et al. | | |
| 2005/0256240 A1 | 11/2005 | Nelson | | |
| 2007/0116976 A1 | 5/2007 | Tan et al. | | |
| 2007/0117886 A1 | 5/2007 | Tan et al. | | |
| 2007/0117913 A1 | 5/2007 | Tan et al. | | |
| 2007/0258190 A1 | 11/2007 | Irwin et al. | | |

FOREIGN PATENT DOCUMENTS

| | | |
|---|---|---|
| CN | 1670073 | 9/2005 |
| EP | 1790684 | 5/2007 |
| EP | 1791195 | 5/2007 |
| EP | 1791195 A1 * | 5/2007 |
| EP | 1843406 | 10/2007 |
| EP | 1843406 A1 * | 10/2007 |
| JP | 58141222 | 8/1983 |

(Continued)

OTHER PUBLICATIONS

EP Search Report, EP06124499, Feb. 27, 2007.

(Continued)

*Primary Examiner* — Peter D. Mulcahy
*Assistant Examiner* — Henry Hu
(74) *Attorney, Agent, or Firm* — Ann M. Agosti

(57) ABSTRACT

A composition comprises a modified polymeric material and a ceramic antiferroelectric particle. The modified polymeric material comprises a high temperature polymer chemically combined with a polar group. A method of making a composition comprises chemically combining a high temperature polymer with a polar group to form a modified polymeric material; and combining the modified polymeric material with antiferroelectric particles to form a composite composition.

22 Claims, 3 Drawing Sheets

Effect of Polymer Permittivity

FOREIGN PATENT DOCUMENTS

| | | |
|---|---|---|
| JP | 2007157413 | 6/2007 |
| WO | 03054259 | 7/2003 |
| WO | WO2006124670 | 11/2006 |

OTHER PUBLICATIONS

CN1670073, English Abstract, D. Lijie et al., Sep. 21, 2005.

JP58141222, Publication Date Aug. 22, 1983, "High-Dielectric Film" (Abstract Only).

C.K. Campbell, "Experimental and Theoretical Characterization of an Antiferroelectric Ceramic Capacitor for Power Electronics", IEEE Transactions on Components and Packaging Technologies, vol. 25, No. 2, pp. 211-216, Jun. 2002.

J. Xu et al., "Low-loss percolative dielectric composite" Applied Physics Letters 87, 082907, pp. 082907-1-082907-3, 2005.

Y. Bai et al., "High-dielectric constant ceramic-powder polymer composites", Applied Physics Letters, vol. 76, No. 25, pp. 3804-3806, published Jun. 19, 2000.

E. Aulagner et al., "(PVD/BaTiO3) and (PP/BaTiO3) Films for Energy Storage Capacitors" 1995 IEEE 5th International Conference on Conduction and Breakdown in Solid Dielectrics, pp. 423-427, 1995.

D. Dimos, "Perovskite Thin Films for High-Frequency Capacitor Applications", Annual Review of Materials Science, vol. 28: 397-419 (Volume publication date Aug. 1998).

EP Search Report, EP 09162433, Oct. 1, 2009.

EP Search Report, EP 09162117, Sep. 24, 2009.

JP Abstract 2007157413, Jun. 21, 2007.

\* cited by examiner

HIGH TEMPERATURE POLYMER COMPOSITES AND METHODS OF MAKING THE SAME

FIELD OF THE INVENTION

The invention includes embodiments that relate to a high temperature polymer composite. The invention includes embodiments that relate to a method of making a high temperature composite and articles comprising the same.

BACKGROUND OF THE INVENTION

It is desirable in commercial applications and devices, such as thin film capacitors, to have a high breakdown voltage and corona resistance. This is particularly the case in high energy density power conversion applications wherein the capacitor must withstand the high voltage and high temperature environments such as motors and generators. In the electronics industry, it is also desirable to have a suitable high dielectric constant, namely high permittivity, material that satisfies the electrical, reliability, and processing requirements for incorporating capacitors into a printed wiring board. Accordingly, in the electronics industry, as well as in the automotive industry, there is a need for new polymeric composites having a high dielectric constant and a high breakdown strength as well as good mechanical strength and processability.

It is therefore desirable to have a composition that combines a high dielectric constant and a high breakdown strength as well as improved material processability and mechanical properties over currently existing high dielectric constant composites.

BRIEF SUMMARY OF THE INVENTION

In one embodiment a composition comprises a modified polymeric material and a ceramic antiferroelectric particle. The modified polymeric material comprises a high temperature polymer chemically combined with a polar group.

In another embodiment, a method of making a composition comprises chemically combining a high temperature polymer with a polar group to form a modified polymeric material; and combining the modified polymeric material with antiferroelectric particles to form a composite composition.

DETAILED DESCRIPTION OF THE INVENTION

Figure 1:
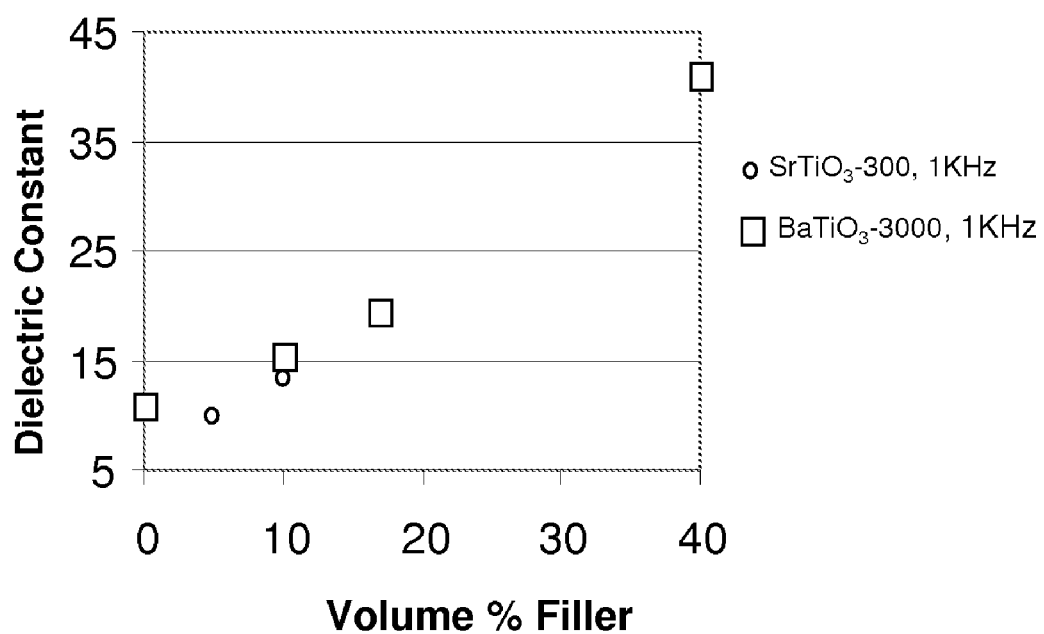
FIG. 1 is a graph illustrating the increase in dielectric constant as a function of the amount of different nanosized ferroelectric particles incorporated into a polymeric material.

Disclosed herein are compositions comprising a modified polymeric material and ceramic antiferroelectric particles. The compositions have high dielectric constant, high energy density, flexibility, and extrudability for subsequent film forming processes.

The ceramic antiferroelectric particles can be converted to ferroelectric particles upon the application of an activating field. In one embodiment, the activating field can comprise a biasing electrical field. In another embodiment, the activating field can comprise a biasing electric field that is applied in the presence of a source of thermal energy, such as, for example, an oven. Thus, the antiferroelectric particles are field-tunable, nonlinear dielectric particles that can undergo a phase transition from a low dielectric state (antiferroelectric state) to a high dielectric state (ferroelectric state) upon being exposed to a biasing electric field. These advantageous properties of the antiferroelectric particles permit the composition to be field tunable. Field tunable compositions can advantageously have their dielectric properties adjusted upon demand depending upon the application for which they are to be used.

The ferroelectric effect is an electrical phenomenon whereby certain ionic crystals may exhibit a spontaneous dipole moment. There are two main types of ferroelectrics, displacive and order-disorder. For example, the effect in barium titanate (BT) and strontium titanate (ST), is of the displacive type and is due to a polarization catastrophe, in which, if an ion is displaced from equilibrium slightly, the force from the local electric fields due to the ions in the crystal increases faster than the elastic restoring forces. This leads to an asymmetrical shift in the equilibrium ion positions and hence to a permanent dipole moment. In an order-disorder ferroelectric, there is a dipole moment in each unit cell, but at high temperatures they are pointing in random directions. Upon lowering the temperature and going through the phase transition, the dipoles order, all pointing in the same direction within a domain.

As a result of the aforementioned ordering that occurs in ferroelectric materials, these materials have a high dielectric constant of greater than or equal to about 1000. In an antiferroelectric transition individual dipoles become arranged antiparallel to adjacent dipoles with the result that the net spontaneous polarization is zero. Thus materials in their antiferroelectric states generally have a lower dielectric constant of about 100 to about 1000. The antiferroelectric particles can exist in the form of nanoparticles or micrometer sized particles. These antiferroelectric particles generally have a dielectric constant that is similar to or moderately higher than the dielectric constant of the modified polymeric material. This permits a higher electric field penetration into the particles when compared with ferroelectric particles.

As noted above, the antiferroelectric particles intrinsically undergo a phase transition from being antiferroelectric to ferroelectric upon the application of an electric field. The antiferroelectric particles upon being dispersed in the modified polymeric material can be triggered to undergo a phase transition from the antiferroelectric state to the ferroelectric state upon the application of an electrical field of less than or equal to about 100 kilovolts/millimeter. As a result, the dielectric constant of the modified polymeric composite would be increased by an amount of greater than or equal to about 300% when compared with a modified polymeric material that does not contain the antiferroelectric particles.

The antiferroelectric particles can be advantageously dispersed in the modified polymeric material in order to increase the dielectric constant of the composition. The well-dispersed particles within the modified polymeric material provide improved properties over a modified polymeric material that does not contain the antiferroelectric particles. These improved properties include a higher dielectric constant, higher energy densities, good breakdown strength, corona resistance, improved impact strength and mechanical hardness, as well as improved ease of processing for soft polymers and a Class A surface finish.

FIG. 1 displays the effect the high dielectric constant ceramic particles have on the dielectric constant of the composition. As the volume percent of the ferroelectric particles in the composition is increased, the dielectric constant of the composition is increased. As shown in FIG. 1, $BaTiO_3$ particles having a dielectric constant of 3000, and $SrTiO_3$ particles having a dielectric constant of 300, each have the ability to increase the dielectric constant of a polymer in a similar manner, particularly at higher loading levels.

In one embodiment, the composition has a breakdown strength of greater than or equal to about 200 kilovolts/millimeter. The composition advantageously has an energy density of greater than or equal to about 1 $J/cm^3$ to greater than or equal to about 10 $J/cm^3$. In addition, with the use of the biasing electric field, the dielectric constant of the composition can be increased by up to one order of magnitude depending upon the amount of the ceramic antiferroelectric particles in the composition. For example, a poly(vinylidene-fluoride-co-hexafluoropropylene) (PVDF-HFP) film with 30 volume % nPZ displayed a significant increase in dielectric constant when exposed to an electric field. The dielectric constant was derived from a polarization loop measurement indicating a strong increase of from ~25 at 5 kV/mm to ~90 at 160 kV/mm.

The modified polymeric material comprises a high temperature, high dielectric constant polymer that is chemically combined with a polar group. The modified polymeric material provides a matrix for nonlinear fillers such as antiferroelectric particles. The high temperature polymer may be selected from a wide variety of thermoplastic polymers, thermosetting polymers, blends of thermoplastic polymers, blends of thermosetting polymers, or blends of thermoplastic polymers with thermosetting polymers. The high temperature polymer can comprise a homopolymer, a copolymer such as a star block copolymer, a graft copolymer, an alternating block copolymer or a random copolymer, ionomer, dendrimer, or a combination comprising at least one of the foregoing. The high temperature polymer may also be a blend of polymers, copolymers, or the like, or a combination comprising at least one of the foregoing.

Examples of high temperature thermoplastic polymers that can be used in the modified polymeric material include polyacetals, polyacrylics, polycarbonates, polyalkyds, polystyrenes, polyolefins, polyesters, polyamides, polyaramides, polyamideimides, polyarylates, polyurethanes, epoxies, phenolics, silicones, polyarylsulfones, polyethersulfones, polyphenylene sulfides, polysulfones, polyimides, polyetherimides, polytetrafluoroethylenes, polyetherketones, polyether etherketones, polyether ketone ketones, polybenzoxazoles, polyoxadiazoles, polybenzothiazinophenothiazines, polybenzothiazoles, polypyrazinoquinoxalines, polypyromellitimides, polyquinoxalines, polybenzimidazoles, polyoxindoles, polyoxoisoindolines, polydioxoisoindolines, polytriazines, polypyridazines, polypiperazines, polypyridines, polypiperidines, polytriazoles, polypyrazoles, polycarboranes, polyoxabicyclononanes, polydibenzofurans, polyphthalides, polyacetals, polyanhydrides, polyvinyl ethers, polyvinyl thioethers, polyvinyl ketones, polyvinyl halides, polyvinyl nitriles, polyvinyl esters, polysulfonates, polysulfides, polythioesters, polysulfones, polysulfonamides, polyureas, polyphosphazenes, polysilazanes, polypropylenes, polyethylene terephthalates, polyvinylidene fluorides, polysiloxanes, polyphenylene ether, cyanoethyl cellulose, cellulose triacetate, or the like, or a combination comprising at least one of the foregoing thermoplastic polymers.

Exemplary high temperature thermoplastic polymers include polyetherimide, polyvinylidene fluoride, polyvinylidine fluoride-trifluoroethylene P(VDF-TrFE), polyvinylidene-tetrafluoroethylene copolymers P(VDF-TFE), and polyvinylidine hexafluoropropylene copolymers P(VDF-HFP), epoxy, polyester, polyimide, polyarylate, polyphenylsulfone, polystyrene, polyethersulfone, polyamideimide, polyurethane, polycarbonate, polyetheretherketone, polyphenylene ether, cyanoethyl cellulose, cellulose triacetate, or the like, or a combination comprising at least one of the foregoing.

Examples of blends of thermoplastic polymers include acrylonitrile-butadiene-styrene/nylon, polycarbonate/acrylonitrile-butadiene-styrene, polyphenylene ether/polystyrene, polyphenylene ether/polyamide, polycarbonate/polyester, polyphenylene ether/polyolefin, cellulosic cyanoresin/cellulose triacetate, cyanoethyl pullulan/polyvinylidine fluoride or the like, or a combination comprising at least one of the foregoing. In a preferred embodiment, the high temperature polymer is a polyetherimide.

Examples of high temperature thermosetting polymers that can be used in the modified polymeric material are resins of epoxy/amine, epoxy/anhydride, isocyanate/amine, isocyanate/alcohol, unsaturated polyesters, vinyl esters, unsaturated polyester and vinyl ester blends, unsaturated polyester/urethane hybrid resins, polyurethane-ureas, thermosetting polyphenylene ether, silicone, fluorosilicone, benzimidazoles, cyanate esters, bismaleimides, reactive dicyclopentadiene resin, reactive polyamides, or the like, or a combination comprising at least one of the foregoing.

In one embodiment, suitable high temperature thermosetting polymers include thermosetting polymers that can be made from an energy activatable thermosetting pre-polymer composition. Examples include polyurethanes such as urethane polyesters, silicone polymers, phenolic polymers, amino polymers, epoxy polymers, bismaleimides, polyimides, and furan polymers. The energy activatable thermosetting pre-polymer component can comprise a polymer precursor and a curing agent. The polymer precursor can be heat activated, eliminating the need for a catalyst. The curing agent selected will not only determine the type of energy source needed to form the thermosetting polymer, but may also influence the resulting properties of the thermosetting polymer. Examples of curing agents include aliphatic amines, aromatic amines, acid anhydrides, peroxides, lewis acids or the like, or a combination comprising at least one of the foregoing. The energy activatable thermosetting pre-polymer composition may include a solvent or processing aid to lower the viscosity of the composition for ease of extrusion including higher throughputs and lower temperatures. The solvent could help retard the crosslinking reaction and could partially or totally evaporate during or after polymerization. The solvent could also act as a reactive diluent, acting as a viscosity aid before cure and reacting into the final polymer during the curing process.

In one embodiment, the high temperature polymer is present in an amount of about 10 weight percent to about 99 weight percent of the total weight of the modified polymeric material. In another embodiment, the high temperature polymer is present in an amount of about 50 weight percent to about 99 weight percent of the total weight of the modified polymeric material. In another embodiment, the high temperature polymer is present in an amount of about 80 weight percent to about 99 weight percent of the total weight of the modified polymeric material.

It is desirable for the high temperature polymer to have a glass transition or softening temperature of greater than or equal to about 150 degrees Celsius. In one embodiment, it is desirable for the high temperature polymer to have a glass transition or softening temperature of greater than or equal to about 180 degrees Celsius. In another embodiment, it is desirable for the high temperature polymer to have a glass transition or softening temperature of greater than or equal to about 200 degrees Celsius. In yet another embodiment, it is desirable for the high temperature polymer to have a glass transition or softening temperature of greater than or equal to about 250 degrees Celsius.

It is also desirable for the high temperature polymer to have a permittivity of greater than or equal to about 4. In one embodiment, it is desirable for the high temperature polymer to have a permittivity of greater than or equal to about 7. In another embodiment, it is desirable for the high temperature polymer to have a permittivity of greater than or equal to about 10. In yet another embodiment, it is desirable for the high temperature polymer to have a permittivity of greater than or equal to about 15. In yet another embodiment, it is desirable for the high temperature polymer to have a permittivity of greater than or equal to about 20.

Examples of polar groups that can be used to form the modified polymeric material include nitrile (CN), fluorine (F), hydroxyl (OH) groups or the like, or a combination comprising at least one of the foregoing thermoplastic polymers. In a preferred embodiment, the polar group is nitrile.

The high temperature polymer may be reacted with the polar group by any method known to those having skill in the art. For example, the high temperature polymer may be reacted with the polar group by effecting a reaction between bisimide and m-phenyleneidiamine.

The modified polymeric material formed from the high temperature polymer and polar group preferably has a glass transition temperature of greater than or equal to about 120 degrees Celsius. In one embodiment, it is desirable for the modified polymeric material to have a glass transition temperature of greater than or equal to about 150 degrees Celsius. In another embodiment, it is desirable for modified polymeric material to have a glass transition temperature of greater than or equal to about 180 degrees Celsius. In yet another embodiment, it is desirable for the modified polymeric material to have a glass transition temperature of greater than or equal to about 200 degrees Celsius. In yet another embodiment, it is desirable for the modified polymeric material to have a glass transition temperature of greater than or equal to about 250 degrees Celsius.

It is also desirable for the modified polymeric material to have a dielectric constant of greater than or equal to about 4. In one embodiment, it is desirable for the modified polymeric material to have a dielectric constant of greater than or equal to about 7. In another embodiment, it is desirable for the modified polymeric material to have a dielectric constant of greater than or equal to about 10. In yet another embodiment, it is desirable for the modified polymeric material to have a dielectric constant of greater than or equal to about 15. In yet another embodiment, it is desirable for the composition to have a dielectric constant of greater than or equal to about 20.

The tensile strength of the modified polymeric material is one measure of the flexibility and ductility of the material. It is desirable for the modified polymeric material to have a tensile strength of greater than or equal to about 2,000 psi. In another embodiment, the modified polymeric material has a tensile strength greater than or equal to about 5,000 psi. In another embodiment, the modified polymeric material has a tensile strength greater than or equal to about 10,000 psi. In another embodiment, the modified polymeric material has a tensile strength greater than or equal to about 15,000 psi. In yet another embodiment, the modified polymeric material has a tensile strength greater than or equal to about 20,000 psi.

The modified polymeric material has a ductility that is equal to or higher than the ductility of the high temperature polymer.

The elongation of the modified polymeric material is preferably greater than or equal to about 3%. In one embodiment, the elongation of the modified polymeric material is greater than or equal to about 5%. In another embodiment, the elongation of the modified polymeric material is greater than or equal to about 7%. In yet another embodiment, the elongation of the modified polymeric material is greater than or equal to about 10%.

In one embodiment, the modified polymeric material is present in an amount of about 5 to about 99.999 weight % of the total weight of the composition. In another embodiment, the modified polymeric material is present in an amount of about 10 weight % to about 99.99 weight % of the total weight of the composition. In another embodiment, the modified polymeric material is present in an amount of about 30 weight % to about 99.5 weight % of the total weight of the composition. In another embodiment, the modified polymeric material is present in an amount of about 50 weight % to about 99.3 weight % of the total weight of the composition.

The antiferroelectric particles are generally between their antiferroelectric and ferroelectric state prior to incorporating them into the composition. It is generally desirable for the antiferroelectric particles in the antiferroelectric state to have a dielectric constant that is as close as possible to the dielectric constant of the modified polymeric material. In one embodiment, the antiferroelectric particles (in the antiferroelectric state) have a dielectric constant whose value is within 10% of the value of the dielectric constant of the modified polymeric material. In another embodiment, the antiferroelectric particles (in the antiferroelectric state) have a dielectric constant whose value is within 50% of the value of the dielectric constant of the modified polymeric material. In yet another embodiment, the antiferroelectric particles (in the antiferroelectric state) have a dielectric constant whose value is within 100% of the value of the dielectric constant of the modified polymeric material. In yet another embodiment, the antiferroelectric particles (in the antiferroelectric state) have a dielectric constant whose value is within 500% of the value of the dielectric constant of the modified polymeric material. Examples of antiferroelectric particles are those derived from perovskite.

In one embodiment, the antiferroelectric particle is one that has the formula (I) $Pb(M_1, M_2, M_3, \ldots)O_3$ (I) where $M_1$, $M_2$, $M_3$, are transition metals or rare earth metals. Examples of transition metals are those present in groups 3d, 4d and 5d of the periodic table, such as, of example, scandium, iron, titanium chromium, zirconium, or the like, or a combination comprising at least one of the foregoing transition metals. Examples of rare earth metals are lanthanum, cerium, neodymium, gadolinium, samarium, or the like, or a combination comprising at least one of the foregoing rare earth metals.

An example of an antiferroelectric particle is one that comprises lead zirconium titanate (PZT) shown in the formula (II) below: $Pb(Zr_xTi_{1-x})O_3$ (III) where x is less than or equal to about 1. In one embodiment, x can have a value of about 0.3 to about 1. In another embodiment, x can have a value of about 0.6 to about 1. In yet another embodiment, x can have a value of about 0.9 to about 1. The PZT antiferroelectric particles exist in the form of a solid solution that spans a wide compositional space and, consequently, a wide range of dielectric properties. The phase boundaries and electrical properties of PZT can also be further modified by doping. For example, substitution of $La^{3+}$ for $Pb^{2+}$ can lead to ferroelectric particles with a dielectric constant up to 7000 that can be converted into antiferroelectric particles. Examples of PZT and PZT derivatives include $PbHfO_3$, $PbZrO_3$, modified $Pb(ZrTi)O_3$, $PbLa(ZrSnTi)O_3$, $PbNb(ZrSnTi)O_3$, or the like, or a combination comprising at least one of the foregoing antiferroelectric particles. An exemplary antiferroelectric particle is lead zirconate ($PbZrO_3$).

Another example of an antiferroelectric particle is one that comprises lead lanthanum zirconium titanates (PLZT) in formula (III): $Pb_{1-x}La_x(Zr_yTi_{1-y})_{1-x/4}O_3$ (III) where x and y can each have a value of up to 1 respectively and wherein x and y are independent of each other. In one embodiment, x can have a value of about 0.1 to about 0.3, while y can have a value of about 0.8 to about 1.

Yet another example of an antiferroelectric particle is one that comprises lead scandium niobates (PSN) in formula (IV) or lead scandium tantalate (PST) in formula (V): $PbSc_xNb_{1-y}O_3$ (IV) $PbSc_xTa_{1-x}O_3$ (V).

Other antiferroelectric particles are $PbSc_{1/2}Nb_{1/2}O_3$—$PbLu_{1/2}Nb_{1/2}O_3$, $SrTiO_3$—$PbZrO_3$, lead scandium niobium titanate (PSNT) and lead lutetium niobium titanate (PLuNT).

In another embodiment, the antiferroelectric particles are lead-free. Examples of antiferroelectric particles include $NaNbO_3$, $(K,Na)(Nb,Ta)O_3$, $KNbO_3$, $BaZrO_3$, $Na_{0.25}K_{0.25}Bi_{0.5}TiO_3$, $Ag(Ta,Nb)O_3$ and $Na_{0.5}Bi_{0.5}TiO_3$—$K_{0.5}Bi_{0.5}TiO_3$—$BaTiO_3$ or the like, or a combination comprising at least one of the foregoing lead-free antiferroelectric particles.

As noted above, the particles can undergo a phase transition from a low dielectric constant (antiferroelectric state) to a high dielectric constant (ferroelectric state) when subjected to an electrical biasing field. In one embodiment, the antiferroelectric particles can undergo a phase transition from an antiferroelectric (low dielectric constant) state to a ferroelectric (high dielectric constant) state when subjected to an electrical biasing field of greater than or equal to about 4 kilovolts/millimeter (kV/mm). In one embodiment, the antiferroelectric particles can undergo a phase transition from an antiferroelectric (low dielectric constant) state to a ferroelectric (high dielectric constant) state when subjected to an electrical biasing field of greater than or equal to about 60 kilovolts/millimeter (kV/mm). In yet another embodiment, the antiferroelectric particles that can undergo a phase transition from an antiferroelectric (low dielectric constant) state to a ferroelectric (high dielectric constant) state when subjected to an electrical biasing field of greater than or equal to about 200 kilovolts/millimeter (kV/mm).

In one embodiment, the dielectric constant of the composition increases by greater than or equal to 50% upon the phase transition. In another embodiment, the dielectric constant of the composition increases by greater than or equal to 100% upon the phase transition. In another embodiment, the dielectric constant of the composition increases by greater than or equal to 500% upon the phase transition.

As noted above, the antiferroelectric particles can have particle sizes in the nanometer range ($10^{-9}$ meter range) or micrometer range ($10^{-6}$ meter range). In one embodiment, the antiferroelectric particles have particle sizes of about 5 nanometers to about 10 micrometers. In another embodiment, the antiferroelectric particles have particle sizes of about 10 nanometers to about 1 micrometer. In another embodiment, the antiferroelectric particles have particle sizes of about 20 nanometers to about 500 nanometers. In yet another embodiment, the antiferroelectric particles have particle sizes of about 40 nanometers to about 200 nanometers.

In one embodiment, the particles can be surface treated to facilitate bonding with the modified polymeric material. In one embodiment, the surface treatment comprises coating the particles with a silane-coupling agent, or if desired, a phosphonic acid may be used to surface treat the particles. Examples of suitable silane-coupling agents include tetramethylchlorosilane, hexadimethylenedisilazane, gamma-aminopropoxysilane, or the like, or a combination comprising at least one of the foregoing silane coupling agents. The silane-coupling agents generally enhance compatibility of the antiferroelectric particles with the modified polymeric material, and phosphonic acid promotes the formation of strong bonds between the antiferroelectric particles and the coupling agent. These functionalizing agents can improve dispersion of the antiferroelectric particles within the modified polymeric material.

As noted above, the antiferroelectric particles have at least one dimension in the nanometer or micrometer range. It is generally desirable for the antiferroelectric particles to have an average largest dimension that is less than or equal to about 10 micrometers. The dimension may be a diameter, edge of a face, length, or the like. The antiferroelectric particles may have shapes whose dimensionalities are defined by integers, e.g., the antiferroelectric particles are either 1, 2 or 3-dimensional in shape. They may also have shapes whose dimensionalities are not defined by integers (e.g., they may exist in the form of fractals). The antiferroelectric particles may exist in the form of spheres, flakes, fibers, whiskers, or the like, or a combination comprising at least one of the foregoing forms. The antiferroelectric particles may have cross-sectional geometries that may be circular, ellipsoidal, triangular, rectangular, polygonal, or a combination comprising at least one of the foregoing geometries. The antiferroelectric particles, as commercially available, may exist in the form of aggregates or agglomerates prior to incorporation into the modified polymeric material or even after incorporation into the polymeric material. An aggregate comprises more than one particle in physical contact with one another, while an agglomerate comprises more than one aggregate in physical contact with one another.

Regardless of the exact size, shape and composition of the antiferroelectric particles, they may be dispersed into the modified polymeric material at loadings of about 0.1 to about 85 wt % of the total weight of the composition when desired. In one embodiment, the antiferroelectric particles are present in an amount of greater than or equal to about 1 wt % of the total weight of the composition. In another embodiment, the antiferroelectric particles are present in an amount of greater than or equal to about 10 wt % of the total weight of the composition. In yet another embodiment, the antiferroelectric particles are present in an amount of greater than or equal to about 30 wt % of the total weight of the composition. In one embodiment, the antiferroelectric particles are present in an amount of less than or equal to 85 wt % of the total weight of the composition. In another embodiment, the antiferroelectric particles are present in an amount of less than or equal to about 70 wt % of the total weight of the composition. In yet another embodiment, the antiferroelectric particles are present in an amount of less than or equal to about 60 wt % of the total weight of the composition.

The modified polymeric material together with the antiferroelectric particles and any other optionally desired fillers may generally be combined in several different ways such as, but not limited to compounding, melt blending, solution blending, or the like, or a combination comprising at least one of the foregoing methods. Melt blending of the composition involves the use of shear force, extensional force, compressive force, ultrasonic energy, electromagnetic energy, thermal energy or a combination comprising at least one of the foregoing forces or forms of energy and is conducted in processing equipment wherein the aforementioned forces are exerted by a single screw, multiple screws, intermeshing co-rotating or counter rotating screws, non-intermeshing co-rotating or counter rotating screws, reciprocating screws, screws with pins, barrels with pins, rolls, rams, helical rotors, or a combination comprising at least one of the foregoing.

Melt blending involving the aforementioned forces may be conducted in machines such as, but not limited to, single or multiple screw extruders, Buss kneader, Henschel, helicones, Ross mixer, Banbury, roll mills, molding machines such as injection molding machines, vacuum forming machines, blow molding machine, or then like, or a combination comprising at least one of the foregoing machines. It is generally desirable during melt or solution blending of the composition to impart a specific energy of about 0.01 to about 10 kilowatt-hour/kilogram (kwhr/kg) of the composition. Within this range, a specific energy of greater than or equal to about 0.05, preferably greater than or equal to about 0.08, and more preferably greater than or equal to about 0.09 kwhr/kg is generally desirable for blending the composition. Also desirable is an amount of specific energy less than or equal to about 9, preferably less than or equal to about 8, and more preferably less than or equal to about 7 kwhr/kg for blending the composition.

The particles can be in the antiferroelectric state or the ferroelectric state prior to the incorporation into the modified polymeric material. The particles that are in the ferroelectric state after incorporation into the modified polymeric material are converted to the antiferroelectric state prior to use in a particular application. In general, it is desirable for the particles to be in the antiferroelectric state prior to use in a particular application. As noted above, a biasing electric field of less than or equal to about 100 kilovolts/millimeter is generally used to change the state of the antiferroelectric particles (from the antiferroelectric state to the ferroelectric state) that are incorporated into the polymers. This biasing electric field can be accompanied by the application of heat to the sample. Heat may be applied in the form of convection, conduction or radiation to the sample during the application of a biasing electrical field.

In one embodiment, the modified polymeric material in powder form, pellet form, sheet form, or the like, may be first dry blended with the antiferroelectric particles and other optional fillers if desired in a Henschel or a roll mill, prior to being fed into a melt blending device such as an extruder or Buss kneader. In another embodiment, the antiferroelectric particles are introduced into the melt blending device in the form of a masterbatch. In such a process, the masterbatch may be introduced into the melt blending device downstream of the modified polymeric material.

When a masterbatch is used, the antiferroelectric particles may be present in the masterbatch in an amount of about 10 to about 85 wt %, of the total weight of the masterbatch. In one embodiment, the antiferroelectric particles are used in an amount of greater than or equal to about 30 wt % of the total weight of the masterbatch. In another embodiment, the antiferroelectric particles are used in an amount of greater or equal to about 40 wt %, of the total weight of the masterbatch. In another embodiment, the antiferroelectric particles are used in an amount of greater than or equal to about 45 wt %, of the total weight of the masterbatch. In one embodiment, the antiferroelectric particles are used in an amount of less than or equal to about 85 wt %, of the total weight of the masterbatch. In another embodiment, the antiferroelectric particles are used in an amount of less than or equal to about 75 wt %, of the total weight of the masterbatch. In another embodiment, the antiferroelectric particles are used in an amount of less than or equal to about 65 wt %, of the total weight of the masterbatch.

The composition comprising the modified polymeric material and the antiferroelectric particles may be subject to multiple blending and forming steps if desirable. For example, the composition may first be extruded and formed into pellets. The pellets may then be fed into a molding machine where it may be formed into other desirable shapes. Alternatively, the composition emanating from a single melt blender may be formed into sheets or strands and subjected to post-extrusion processes such as annealing, uniaxial or biaxial orientation.

Solution blending may also be used to manufacture the composition. The solution blending may also use additional energy such as shear, compression, ultrasonic vibration, or the like to promote homogenization of the particles with the polymeric material. In one embodiment, a modified polymeric material suspended in a fluid (e.g., a solvent) may be introduced into an ultrasonic sonicator along with the antiferroelectric particles. The mixture may be solution blended by bead milling followed by sonication for a time period effective to break up and disperse the antiferroelectric particles within the modified polymeric material and the fluid. The modified polymeric material along with the antiferroelectric particles may then be dried, extruded and molded if desired. It is generally desirable for the fluid to swell the modified polymeric material during the process of sonication. Swelling the modified polymeric material generally improves the ability of the antiferroelectric particles to be impregnated with the modified polymeric material during the solution blending process and consequently improves dispersion.

In another embodiment related to solution blending, the antiferroelectric particles are sonicated together with modified polymeric material precursors. Modified polymeric material precursors are generally monomers, dimers, trimers, or the like, which can be reacted into polymeric materials. A fluid such as a solvent may optionally be introduced into the sonicator with the antiferroelectric particles and the modified polymeric material precursors. The time period for the sonication is generally an amount effective to promote encapsulation of the antiferroelectric particles by the polymeric material precursors. After the encapsulation, the modified polymeric material precursor is then polymerized to form a composition within which is dispersed the antiferroelectric particles.

Suitable examples of monomers that may be used to facilitate this method of encapsulation and dispersion are those used in the synthesis of polymers such as, but not limited to polyacetals, polyacrylics, polycarbonates, polystyrenes, polyesters, polyamides, polyamideimides, polyarylates, polyurethanes, polyarylsulfones, polyethersulfones, polyarylene sulfides, polyvinyl chlorides, polysulfones, polyetherimides, polytetrafluoroethylenes, polyetherketones, polyether etherketones, or the like, or a combination comprising at least one of the foregoing. In one embodiment, the mixture of modified polymeric material precursors, fluid and/or the particles is sonicated for a period of about 1 minute to about 24 hours. In another embodiment, the mixture is sonicated for a period of greater than or equal to about 5 minutes. In another embodiment, the mixture is sonicated for a period of greater than or equal to about 10 minutes. In another embodiment, the mixture is sonicated for a period of greater than or equal to about 15 minutes. In one embodiment, the mixture is sonicated for a period of less than or equal to about 15 hours. In another embodiment, the mixture is sonicated for a period of less than or equal to about 10 hours. In another embodiment, the mixture is sonicated for a period of and more preferably less than or equal to about 5 hours.

Solvents may optionally be used in the solution blending of the composition. The solvent may be used as a viscosity modifier, or to facilitate the dispersion and/or suspension of particles. Liquid aprotic polar solvents such as propylene carbonate, ethylene carbonate, butyrolactone, acetonitrile, benzonitrile, nitromethane, nitrobenzene, sulfolane, dimethylformamide, N-methylpyrrolidone (NMP), or the like, or a combination comprising at least one of the foregoing solvents may be used. Polar protic solvents such as water, methanol, acetonitrile, nitromethane, ethanol, propanol, isopropanol, butanol, or the like, or a combination comprising at least one of the foregoing polar protic solvents may be used. Other non-polar solvents such as benzene, toluene, methylene chloride, carbon tetrachloride, hexane, diethyl ether, tetrahydrofuran, or the like, or a combination comprising at least one of the foregoing solvents may also be used if desired. Co-solvents comprising at least one aprotic polar solvent and at least one non-polar solvent may also be used. In one embodiment, the solvent is xylene or N-methylpyrrolidone.

If a solvent is used, it may be utilized in an amount of about 1 to about 90 wt %, of the total weight of the composition. In one embodiment, if a solvent is used, it may be utilized in an amount of about 2 to about 50 wt %, of the total weight of the composition. In yet another embodiment, if a solvent is used, it may be utilized in an amount of about 3 to about 30 wt %, of the total weight of the composition. In yet another embodiment, if a solvent is used, it may be utilized in an amount of about 5 to about 20 wt %, of the total weight of the composition. It is generally desirable to evaporate the solvent before, during and/or after the blending of the composition.

After solution blending, the solution comprising the desired composition can be cast, spin cast, dip coated, spray painted, brush painted and/or electrostatically spray painted onto a desired substrate. The solution is then dried leaving behind the composition on the surface. In another embodiment, the solution comprising the desired composition may be spun, compression molded, injection molded or blow molded to form an article comprising the composition.

Blending can be assisted using various secondary species such as dispersants, binders, modifiers, detergents, and additives. Secondary species may also be added to enhance one to more of the properties of the composition. Blending can also be assisted by pre-coating the particles with a thin layer of the polymeric material or with a phase that is compatible with the modified polymeric material, such as, for example a silane layer or a phosponic acid layer.

Figure 2:
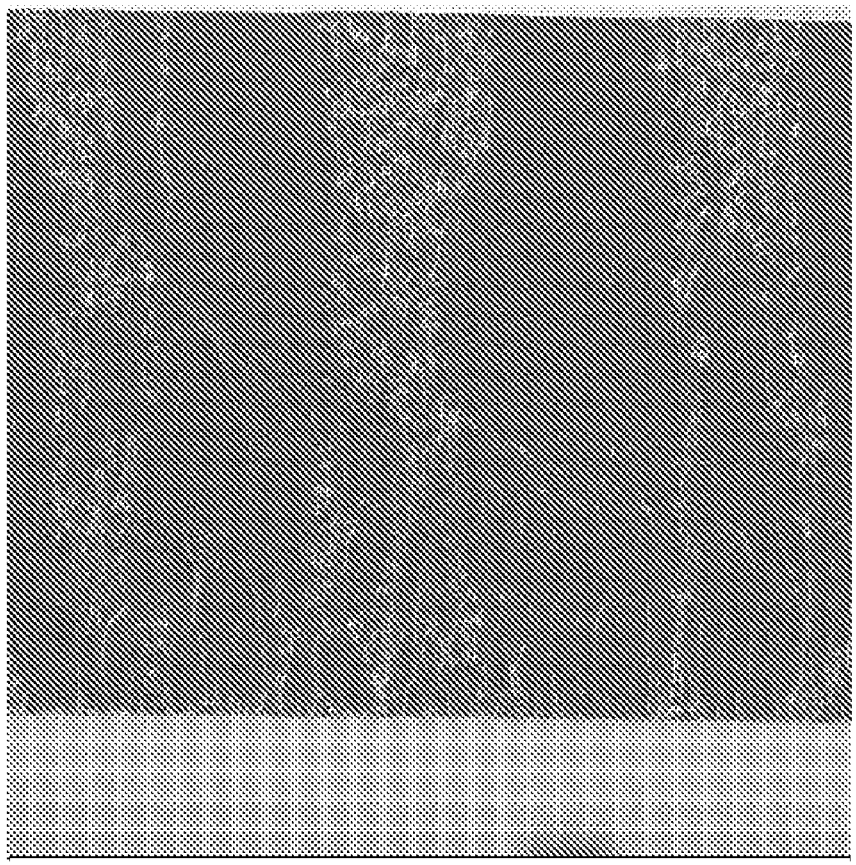
FIG. 2 shows electric field aligned antiferroelectric particles.

In one embodiment, a composition comprising the modified polymeric material and the antiferroelectric particles in random orientations and locations may be subjected to an electrical field in order to orient the antiferroelectric particles. The application of the electrical field can be conducted when the composition is in the melt state or in a solution. Solidification can occur in the presence of the electrical field. Upon being subjected to the electrical field, the antiferroelectric particles can be re-aligned into preferred orientation. In one embodiment, the electric field can be used to align these particles into columnar structure so as to give rise to higher dielectric constant. FIG. 2 illustrates electric field aligned antiferroelectric particles, whereby the dielectric constant of the composition is increased by at least 50%.

A composition comprising a modified polymeric material and the antiferroelectric particles in a low dielectric constant state has advantages over the modified polymeric material alone. In one embodiment, the composition has a dielectric constant that is at least 10% greater than a composition comprising polymeric material alone. In another embodiment, the composition has a dielectric constant that is at least 50% greater than the polymeric material alone. In another embodiment, the composition has a dielectric constant that is at least 100% greater than the polymeric material alone.

Upon applying an electrical field for converting the antiferroelectric particles to ferroelectric particles, the composition can have a dielectric constant that is at least 200% greater than the modified polymeric material alone. In one embodiment, upon conversion, the composition has a dielectric constant that is at least 300% greater than a composition comprising polymeric material alone. In another embodiment, upon conversion, the composition has a dielectric constant that is at least 400% greater than the modified polymeric material alone. In another embodiment, upon conversion, the composition has a dielectric constant that is at least 500% greater than the modified polymeric material alone.

A composition comprising a modified polymeric material and particles in a high dielectric constant state (ferroelectric state) has further advantages over the modified polymeric material and particles in a low dielectric constant state (antiferroelectric state). In one embodiment, the composition has a dielectric constant that is at least 50% greater than a composition comprising a modified polymeric material and particles in a low dielectric constant state. In another embodiment, the composition has a dielectric constant that is at least 100% greater than the modified polymeric material and particles in a low dielectric constant state. In another embodiment, the composition has a dielectric constant that is at least 500% greater than the modified polymeric material and particles in a low dielectric constant state.

The composition also has a breakdown voltage that is advantageously greater than the modified polymeric material alone. In one embodiment, the composition has a breakdown voltage that is at least 50 kilovolts/millimeter. The breakdown is generally determined in terms of the thickness of the composition. In another embodiment, the composition has a breakdown voltage that is at least 100 kilovolts/millimeter. In another embodiment, the composition has a breakdown voltage that is at least 300 kilovolts/millimeter.

The composition also has a corona resistance that is advantageously greater than the modified polymeric material alone. In one embodiment, the composition has a corona resistance that is resistant to a current of about 1000 volts to 5000 volts applied for about 200 hours to about 2000 hours. In another embodiment, the composition has a corona resistance that is resistant to a current of about 1000 volts to 5000 volts applied for about 250 hours to about 1000 hours. In yet another embodiment, the composition has a corona resistance that is resistant to a current of about 1000 volts to 5000 volts applied for about 500 hours to about 900 hours.

The composition has a dielectric constant greater than or equal to about 4 when measured at frequencies of about 1 to about $10^6$ hertz (Hz). In one embodiment, the composition has a dielectric constant greater than or equal to about 7 when measured at frequencies of about 1 to about $10^6$ hertz (Hz). In yet another embodiment, the composition has a dielectric constant greater than or equal to about 10 when measured at frequencies of about 1 to about $10^6$ hertz (Hz). In yet another embodiment, the composition has a dielectric constant greater than or equal to about 50 when measured at frequencies of about 1 to about $10^6$ hertz (Hz).

It is desirable for the composition to have a glass transition or softening point temperature of greater than or equal to about 120 degrees Celsius. In one embodiment, it is desirable for the composition to have a glass transition or softening point temperature of greater than or equal to about 150 degrees Celsius. In another embodiment, it is desirable for composition to have a glass transition or softening point temperature of greater than or equal to about 180 degrees Celsius. In yet another embodiment, it is desirable for the composition to have a glass transition or softening point temperature of greater than or equal to about 200 degrees Celsius. In yet another embodiment, it is desirable for the composition to have a glass transition or softening point temperature of greater than or equal to about 250 degrees Celsius.

It is also desirable for the nanoparticle filled composition to have a permittivity of greater than or equal to about 10. In one embodiment, it is desirable for the composition to have a permittivity of greater than or equal to about 20. In another embodiment, it is desirable for the composition to have a permittivity of greater than or equal to about 30. In yet another embodiment, it is desirable for the composition to have a permittivity of greater than or equal to about 50. In yet another embodiment, it is desirable for the composition to have a permittivity of greater than or equal to about 100.

Figure 3:
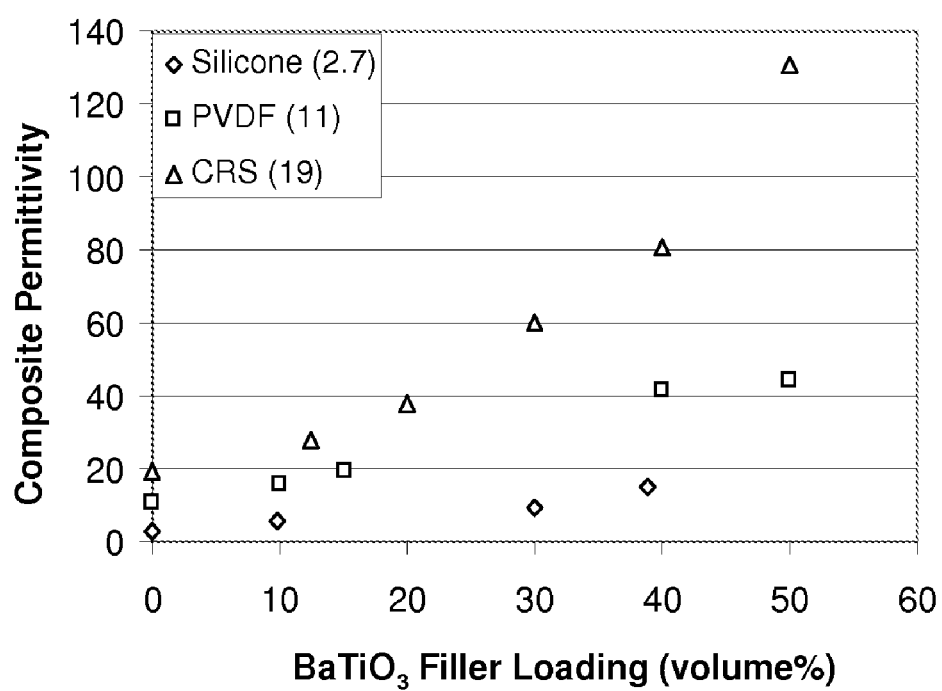
FIG. 3 is a graph illustrating the increase of dielectric constant as a function of the amount of nanosized ferroelectric particles incorporated into a polymeric material, as well as the effect of the permittivity of the polymeric material on such increase.

Referring to FIG. 3, shown is a graph displaying the effect of $BaTiO_3$ ferroelectric particles on the permittivity of various high temperature polymers. As illustrated, the permittivity of the polymer composite increases as the volume percent of the ferroelectric particles in the composite increases. The effectiveness of such an increase in permittivity depends on the permittivity of the matrix material. As shown in the plot, a composite comprising a matrix with a higher permittivity renders a higher overall composite permittivity. For example, at 40% volumetric loading of barium titanate, a composite based on CR (with a permittivity of 19), would have a composite permittivity of 80. Similarly, at 40% volumetric loading of barium titanate, a composite based on PVDF (with a permittivity of 11), would have a composite permittivity of 40. In comparison, a composite based on silicone (with a permittivity of 2.7) would have a composite permittivity of only 16.

The tensile strength of the polymer composition is one measure of the flexibility and ductility of the composition. It is desirable for the composition to have a tensile strength of greater than or equal to about 3,000 psi. In another embodiment, the composition has a tensile strength greater than or equal to about 5,000 psi. In another embodiment, the composition has a tensile strength greater than or equal to about 10,000 psi. In yet another embodiment, the composition has a tensile strength greater than or equal to about 15,000 psi. In yet another embodiment, the composition has a tensile strength greater than or equal to about 20,000 psi.

The elongation of the composition is preferably greater than or equal to about 2%. In one embodiment, the elongation of the composition is greater than or equal to about 4%. In another embodiment, the elongation of the composition is greater than or equal to about 6%. In yet another embodiment, the elongation of the composition is greater than or equal to about 8%.

Compositions that comprise the nanoparticles may also be optically transparent. In one embodiment, the compositions have a transmissivity to visible light of greater than or equal to about 70%. In another embodiment, the compositions have a transmissivity to visible light of greater than or equal to about 80%. In yet another embodiment, the compositions have a transmissivity to visible light of greater than or equal to about 90%. In yet another embodiment, the compositions have a transmissivity to visible light of greater than or equal to about 95%. In yet another embodiment, the composition also has a Class A surface finish when molded. Molded articles can be manufactured by injection molding, blow molding, compression molding, or the like, or a combination comprising at least one of the foregoing.

The composition can advantageously be used in energy storage and power conversion devices for applications including transient voltage clamping, ripple voltage reduction and waveform correction in resonant circuit. The composition can advantageously be used in spark plug/ignitor capacitors, defibrillators, and X-ray generators. The compositions are especially useful in capacitors, including thin film capacitors, for a broad range of applications such as power conversion, power conditioning and pulsed power applications.

All ranges disclosed herein are inclusive of the endpoints, and the endpoints are combinable with each other. The terms "first," "second," and the like as used herein do not denote any order, quantity, or importance, but rather are used to distinguish one element from another. The modifiers "about" and "about" used in connection with a quantity are inclusive of the stated value and have the meaning dictated by the context (e.g., includes the degree of error associated with measurement of the particular quantity). The use of the terms "a" and "an" and "the" and similar referents in the context of describing the invention (especially in the context of the following claims) are to be construed to cover both the singular and the plural, unless otherwise indicated herein or clearly contradicted by context.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A composition comprising:
a modified high temperature polymer; and
a ceramic antiferroelectric particle,
wherein the modified high temperature polymer is obtained by chemical modification of a high temperature polymer to add a polar group, and
wherein the modified high temperature polymer has a dielectric constant greater than or equal to about 4, and
wherein the high temperature polymer has a glass transition or softening point temperature of greater than or equal to about 150 degrees Celsius, and
wherein the modified high temperature polymer has a glass transition or softening point temperature of greater than or equal to about 120 degrees Celsius.

2. The composition of claim 1, wherein the high temperature polymer is a thermoplastic polymer or a thermosetting polymer.

3. The composition of claim 2, wherein the high temperature polymer is a polyetherimide resin.

4. The composition of claim 1, wherein the polar group is a nitrile, fluorine, or hydroxyl group.

5. The composition of claim 4, wherein the polar group is a nitrile group.

6. The composition of claim 1, wherein the modified polymeric material has a tensile strength greater than or equal to about 2,000 psi.

7. The composition of claim 1, wherein the antiferroelectric particle in the antiferroelectric state has a dielectric constant whose value is within 50% of the value of the dielectric constant of the modified polymeric material.

8. The composition of claim 1, wherein the antiferroelectric particle comprises a perovskite.

9. The composition of claim 1, wherein the antiferroelectric particle has the general formula (I) $M_1, M_2, M_3, \ldots)O_3$ (I) where $M_1, M_2, M_3$, are transition metals or rare earth metals, Pb is lead and O is oxygen.

10. The composition of claim 1, wherein the antiferroelectric particle comprises lead zirconium titanate (PZT) having the formula (II): $Pb(Zr_xTi_{1-x})O_3$ (II) where x is an amount of up to about 1.

11. The composition of claim 10, wherein x is an amount of about 0.9 to about 1.

12. The composition of claim 1, wherein the antiferroelectric particle comprises $PbHfO_3$, $PbZrO_3$, modified $Pb(ZrTi)O_3$, $PbLa(ZrSnTi)O_3$, $PbNb(ZrSnTi)O_3$, or a combination comprising at least one of the foregoing antiferroelectric particles.

13. The composition of claim 1, wherein the antiferroelectric particle comprises lead lanthanum zirconium titanates (PLZT) having the formula (III): $Pb_{1-x}La_x(Zr_yTi_{1-y})_{1-x/4}O_3$ (III) where x and y is an amount of up to about 1 respectively and wherein x and y are independent of each other.

14. The composition of claim 13, wherein x is an amount of up to about 0.3 and wherein y is an amount of about 0.8 to about 1.

15. The composition of claim 1, wherein the antiferroelectric particle comprises lead scandium niobates (PSN) having the formula (IV) or lead scandium tantalate (PST) having the formula (V): $PbSc_xNb_{1-y}O_3$ (IV) $PbSc_xTa_{1-x}O_3$ (V) where x is an amount of up to about 1.

16. The composition of claim 1, wherein the antiferroelectric particle comprises lead scandium niobium titanate (PSNT), or lead lutetium niobium titanate (PLuNT).

17. The composition of claim 1, wherein the antiferroelectric particle is lead-free.

18. The composition of claim 1, wherein the antiferroelectric particle comprises $NaNbO_3$, $(K,Na)(Nb,Ta)O_3$, $KNbO_3$, $BaZrO_3$, $Na_{0.25}K_{0.25}Bi_{0.25}TiO_3$, $Ag(Ta,Nb)O_3$, or $Na_{0.5}Bi_{0.5}TiO_3$—$K_{0.5}Bi_{0.5}TiO_3$—$BaTiO_3$.

19. The composition of claim 1, wherein the composition has a permittivity greater than or equal to about 10.

20. An article comprising the composition of claim 1.

21. The article of claim 20, wherein the article is a film.

22. The article of claim 20, wherein the article is a capacitor.

* * * * *

UNITED STATES PATENT AND TRADEMARK OFFICE
CERTIFICATE OF CORRECTION

PATENT NO.         : 8,247,484 B2
APPLICATION NO.    : 12/137564
DATED              : August 21, 2012
INVENTOR(S)        : Tan et al.

It is certified that error appears in the above-identified patent and that said Letters Patent is hereby corrected as shown below:

In Column 16, Line 16, in Claim 18, delete "$Bi_{0.5}$" and insert -- $Bi_{0.3}$ --, therefor.

Signed and Sealed this
Eighteenth Day of December, 2012

David J. Kappos
*Director of the United States Patent and Trademark Office*